United States Patent [19]
Yamazaki et al.

[11] Patent Number: 5,504,365
[45] Date of Patent: Apr. 2, 1996

[54] SPATIAL LIGHT MODULATION DEVICE

[75] Inventors: Tetsuhiro Yamazaki; Atushi Nakano, both of Yokohama; Yuuichi Kuromizu, Yokosuka, all of Japan

[73] Assignee: Victor Company of Japan, Ltd., Yokohama, Japan

[21] Appl. No.: 184,163

[22] Filed: Jan. 21, 1994

[30] Foreign Application Priority Data

| Jan. 21, 1993 | [JP] | Japan | 5-024926 |
| Apr. 28, 1993 | [JP] | Japan | 5-125158 |

[51] Int. Cl.$^6$ ............ H01L 29/90; H01L 27/14; H01L 31/00; G02F 1/13
[52] U.S. Cl. ............ 257/438; 257/458; 257/446; 257/449; 257/452; 345/91; 345/50; 359/71
[58] Field of Search ............ 359/248, 245, 359/250, 253, 254, 294, 316, 67, 71, 72; 257/438, 458, 432, 446, 449, 452; 345/50, 84, 91

[56] References Cited

U.S. PATENT DOCUMENTS

| 4,842,376 | 6/1989 | Braatz et al. ............ 350/342 |
| 4,913,531 | 4/1990 | Efron et al. ............ 350/342 |
| 5,384,649 | 1/1995 | Takimoto et al. ............ 359/67 |
| 5,401,952 | 3/1995 | Sugawa ............ 250/208.1 |

OTHER PUBLICATIONS

United States Statutory Invention Registration: H840.

"The Silicon Liquid–Crystal Light Valve" by U. Efron et al; J. Appl. Phys. 57(4), 15 Feb. 1985; pp. 1356–1368.

*Primary Examiner*—Donald L. Monin, Jr.
*Attorney, Agent, or Firm*—Lowe, Price, LeBlanc & Becker

[57] ABSTRACT

A spatial light modulation device, in which at least a photoconductor structure and a light modulator have a multilayer structure. In this spatial light modulation device, the photoconductor structure has a plurality of pixel portions and avalanche multiplication of charges generated by light incident on each of the pixel portions is performed therein and charges obtained as a result of the avalanche multiplication are stored in the pixel portions. Thus, this spatial light modulation device has high sensibility.

9 Claims, 3 Drawing Sheets

SPATIAL LIGHT MODULATION DEVICE

BACKGROUND OF THE INVENTION

1. Field of the Invention

This invention relates to a spatial light modulation device (hereunder sometimes referred to simply as a spatial light modulator) to be employed as an optical computing element (or arithmetic device) for use in an optical computer or for optical information processing, or employed as a display element for use in a projection display.

2. Description of the Related Art

Hereinafter, a conventional spatial light modulator employing a semiconductor single crystal will be described by referring to FIG. 3. As shown in this figure, a side surface of a high-resistance (or high-resistivity) N-type silicon 2, which is a photoconductor layer, is bonded onto a transparent insulating substrate 1 through an N-type low-resistance layer 3 in this spatial light modulator. Further, a plurality of Schottky electrodes 4 are formed on the other side surface of the high-resistance N-type silicon 2. Each of the Schottky electrodes 4 is separated by insulating films 5 from the others of the Schottky electrodes 4 and forms a pixel electrode. Moreover, a dielectric mirror layer 6 is formed on the Schottky electrodes 4. Furthermore, a transparent electrode 8 and a liquid crystal layer 9 which is employed as a light modulator (or an optical modulator) are held between this dielectric mirror layer 6 and a transparent insulating substrate 7. Incidentally, reference numeral 10 designates spacers which are inserted between the dielectric mirror layer 6 and the transparent electrode 8 and are used to establish a predetermined thickness of the liquid crystal layer 9.

Next, an operation of this conventional spatial light modulator will be described hereinbelow. First, a square-wave voltage is applied from a driving power source 11 across the low-resistance layer 3 and the transparent electrode 8. Then, if a negative voltage is applied to the transparent electrode 8, the Schottky junction is biased in the reverse direction and a depletion layer is extended or enlarged. Further, write light FA, which is incident on the depletion layer from the transparent substrate 1, generates electron-hole pairs. Then, the positive holes are moved to the Schottky electrode 4 through the depletion layer in the presence of an electric field and are further stored in the electrode 4. This results in increase in voltage applied to the liquid crystal layer 9.

Subsequently, when a positive voltage is applied to the transparent electrode 8, the Schottky junction is biased in the forward direction and all of positive charges stored in the electrodes 4 are emitted therefrom. Further, all of the driving voltage is applied to the liquid crystal layer 9.

Thus, a negative voltage to be applied to the transparent electrode 8 is so set that the voltage applied to the liquid crystal layer 9 in a dark state is equal to or less than a driving threshold voltage. On the other hand, a positive voltage is applied to the transparent electrode 8 for a short period of time sufficient to such an extent that the liquid crystal layer 9 does not operate. Thereby, in a portion of the layer 9, on which the write light FA is incident, the direction of polarization of reflection light FC, which is obtained by reflecting read light FB, is modulated due to birefringence (namely, double refraction) thereof occurring in the liquid crystal. Consequently, the modulation of read light corresponding to written information can be realized.

However, the sensibility (or sensitivity) of the conventional monocrystalline spatial light modulator is dependent on the quantum efficiency obtained in the depletion layer. Further, in case of simple Schottky junction, P-N structure or junction, or P-I-N junction, the quantum efficiency can not be more than 1. Thus, the sensibility of the conventional monocrystalline spatial light modulator has its limit.

The present invention is created to eliminate the above described drawback of the conventional spatial light modulator.

It is, therefore, an object of the present invention to provide a spatial light modulator which has high sensibility.

SUMMARY OF THE INVENTION

To achieve the foregoing object and in accordance with an aspect of the present invention, there is provided a spatial light modulation device, wherein at least a photoconductor structure and a light modulator have a multilayer structure, wherein the photoconductor structure has a plurality of pixel portions and avalanche multiplication of charges generated by light incident on each of the pixel portions is performed therein and charges obtained as a result of the avalanche multiplication are stored in the pixel portions.

Further, in accordance with another aspect of the present invention, there is provided a spatial light modulation device, wherein at least a photoconductor structure and a light modulator have a multilayer structure, wherein the photoconductor structure comprises a diode array formed on a semiconductor substrate, which is a Schottky diode array, a PN diode array or a PIN diode array, and a high dopant concentration region which is formed in a vicinity of a Schottky, a PN or a PIN junction of each diode of the diode array and inside of the semiconductor substrate and has a same conductivity type as the semiconductor substrate does, and wherein in a region which is depleted of carriers in a reverse bias state, avalanche multiplication of charges injected therein is performed due to light which is incident thereon.

Thus, the spatial light demodulator of the present invention has a photocurrent multiplication function. Thereby, the sensibility of the spatial light modulator of the present invention can be larger than that of the conventional spatial light demodulator by an order or two orders of magnitude.

Moreover, in an embodiment of this spatial light modulator, a distance W between adjacent diodes of the diode array is less than a depth D of the region which is depleted of carriers in a reverse bias state (namely, W< D).

Thereby, an avalanche photodiode structure can be formed without guard ring layers. Consequently, a high-density packaging of pixel electrodes can be achieved. Moreover, a spatial light modulation device with high sensibility and resolution can be realized.

Furthermore, in accordance with a further aspect of the present invention, there is provided a spatial light modulation device, wherein at least a photoconductor structure and a light modulator have a multilayer structure, wherein the photoconductor structure comprises a diode array formed on a semiconductor substrate, which array consists of a plurality of pixel electrodes each having a Schottky junction, and a high dopant concentration region which is formed in a vicinity of the Schottky junction of each diode of the diode array in common to the plurality of pixel electrodes and inside of the semiconductor substrate and has a same conductivity type as the semiconductor substrate does, and wherein in a region which is depleted of carriers in a reverse bias state, avalanche multiplication of charges injected therein is performed due to light which is incident thereon.

Thereby, in the process of fabricating this spatial light modulation device, a diffusion step is unnecessary. Thus, the fabricating process can be simplified. Moreover, a pixel pitch (namely, an interval between the adjoining pixel electrodes) can be decreased. Thus, a high-density packaging of the pixel electrodes can be achieved. Further, in such a configuration of this spatial light modulator, a potential barrier between the pixels (namely, the pixel electrodes) is large. Consequently, the dynamic range can be large.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Before explaining the preferred embodiments of the present invention, the structure of a photodiode and that of an avalanche photodiode will be described hereinbelow by referring to FIGS. 4(A) and 4(B).

Figure 4A:
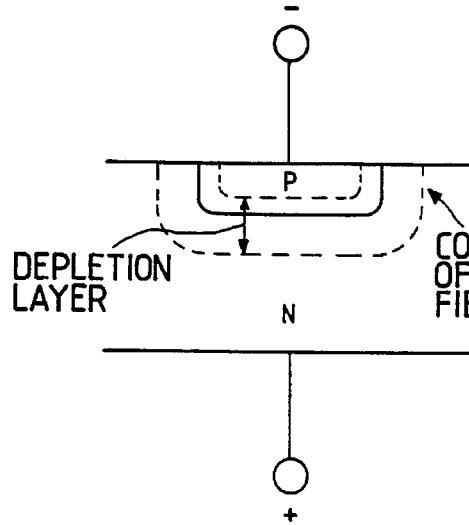
FIG. 4(A) is a diagram for illustrating the structure of an ordinary photodiode.
Figure 4B:
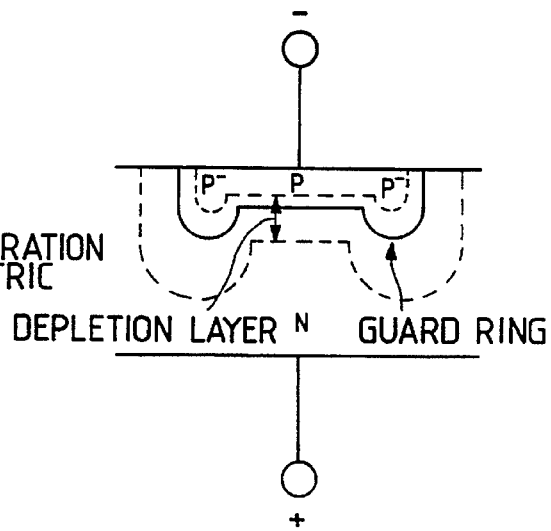
FIG. 4(B) is a diagram for illustrating the structure of an avalanche photodiode.

FIG. 4(A) is a diagram for illustrating the structure of an ordinary photodiode. Further, FIG. 4(B) is a diagram for illustrating the structure of an avalanche photodiode.

Generally, when a reverse voltage is applied to a PN conjunction, the magnitude of the electric field in a depletion layer increases. For example, in case of silicon, when the magnitude of the electric field becomes equal to or more than $2 \times 10^5$ volts (V)/centimeters (cm), ionization is caused by injected carriers. Further, avalanche multiplication starts. Thereafter, when the magnitude of the electric field further increases, a breakdown occurs finally. This avalanche multiplication is caused by not only carriers generated due to the ionization but also carrier generated due to incident light. An avalanche photodiode utilizes this avalanche multiplication. When using an avalanche photodiode, a reverse voltage slightly less than a breakdown voltage, at which the multiplication takes place, is required.

On the other hand, in case of an avalanche photodiode, it is necessary to cause uniform avalanche multiplication on a flat light receiving surface. As illustrated in FIG. 4(A), in case of an ordinary photodiode, concentration (or intensification) of the electric field occurs in a corner of a peripheral portion of the diffusion layer (P region). Thus, a breakdown takes place in the corner before the avalanche multiplication occurs on the flat light receiving surface or portion. Consequently, such a device cannot be an avalanche photodiode. Therefore, there has been devised a method to make the magnitude of the electric field on the light receiving surface higher than that of the electric field in the corner by employing a guard ring or the like to lower the magnitude of the electric field in the corner of the peripheral portion of the diffusion layer.

In case of the spatial light modulator of the present invention, the structure of an avalanche photodiode is employed in the photoconductor layer thereof. Thereby, an extremely-high-sensibility spatial light modulator can be realized.

Hereinafter, the preferred embodiments of the present invention will be described in detail by referring to the accompanying drawings.

Incidentally, the description of composing elements of each preferred embodiment of the present invention, which are similar to corresponding composing elements of the above described conventional spatial light modulator will be omitted hereunder for the simplicity of description.

Figure 1:
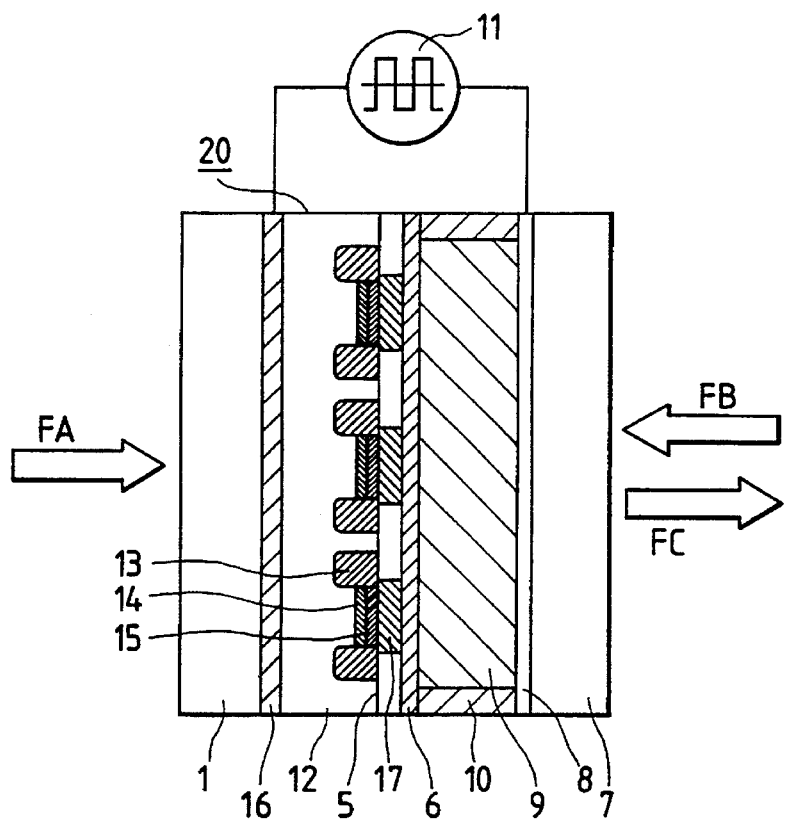
FIG. 1 is a sectional view of a spatial light modulator embodying the present invention (hereunder sometimes referred to as a first embodiment of the present invention)

Further, a first example of a spatial light modulator embodying the present invention (namely, the first embodiment of the present invention) will be described hereinbelow by referring to FIG. 1. Incidentally, the description of composing elements other than a photoconductor structure 20 of the first embodiment, which elements are similar to the corresponding composing elements of the conventional spatial light modulator, is omitted herein for the brevity of description.

First, an example of a method for fabricating a photoconductor structure 20 will be described hereinafter. Further, a high-resistance P-type (π) silicon substrate 12, which has preferably a dopant concentration equal to or less than $1 \times 10^{14}$ cm$^{-3}$ and a resistivity equal to or more than 300 Ω·cm, is employed as a semiconductor substrate, for the purpose of utilizing the avalanche multiplication of electrons. Moreover, N-guard-ring layers 13 are first formed on this high-resistance P-type silicon substrate by, for instance, diffusion. Next, P-layers 14 which have a dopant concentration of from $1 \times 10^{16}$ to $1 \times 10^{17}$ cm$^{-3}$ are formed therein by, for example, ion implantation. Furthermore, an N$^+$-layer 15 is shallowly formed therein by effecting diffusion. Then, a surface of the high-resistance P-type silicon substrate 12 opposite to the surface thereof, on which the above-mentioned pattern is formed, is polished to make the thickness thereof equal to a predetermined thickness. Subsequently, a P$^+$-layer 18 is formed on this polished surface of the high-resistance P-type silicon substrate 12 by effecting ion implantation. After these steps, a silicon nitride film is formed on the N$^+$-layer 15 by a plasma-enhanced chemical vapor deposition (CVD) so as to form the insulating film 5. Further, windows are formed in the insulating layer 5 like a grid by using photolithography techniques. Subsequently, pixel electrodes 17 are formed by producing films of ohmic contact metal in the generated windows by effecting a sputtering or the like.

Figure 3:
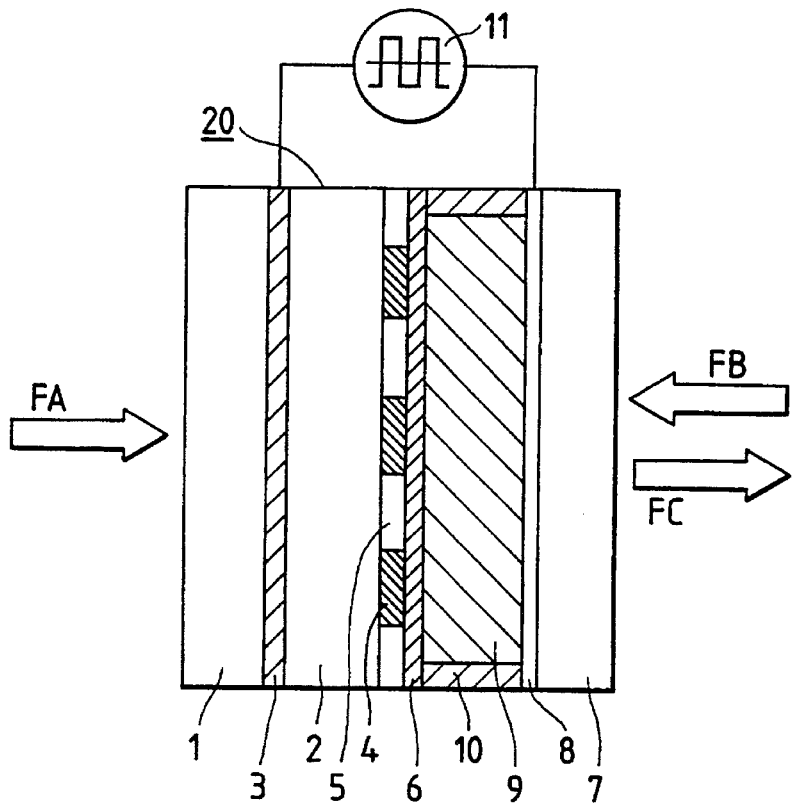
FIG. 3 is a sectional view of an example of a conventional spatial light modulator.

Thereafter, the photoconductor structure 20 made by effecting the foregoing steps is combined with the liquid crystal layer 9 serving as a light modulator, similarly as in case of the conventional spatial light modulator of FIG. 3. Thus, a spatial light modulator is fabricated.

Next, an operation of the spatial light modulator with the above described structure will be described hereinbelow. In the case where a positive voltage V is applied to the transparent electrode 8 of this spatial light modulator, an $N^+P\pi P^+$-junction is put into a reverse bias state. If the value of the voltage is so selected that a P-layer 14 and a π-layer 12 become depleted of carriers, voltages to be applied to the liquid crystal layer 9 and the photoconductor layer 20 are distributed thereto according to the capacitances thereof. Here, let V denote a negative voltage of a driving voltage waveform. Further, let $V_{LC}$ and $C_{LC}$ denote the voltage applied to the liquid crystal layer 9 and the capacitance thereof, respectively. Moreover, $V_{PC}$ and $C_{PC}$ denote the voltage applied to the photoconductor structure 20 and the capacitance thereof, respectively. The voltages $V_{LC}$ and $V_{PC}$ are distributed to the layers 9 and 20, respectively, in a dark state as follows:

$$V_{LC}=C_{PC}V/(C_{LC}+C_{PC}) \quad (1)$$

$$V_{PC}=C_{LC}V/(C_{LC}+C_{PC}) \quad (2)$$

Therefore, the capacitance $C_{LC}$ of the liquid crystal layer 9, the carrier concentrations of the P-layer 14 and the π-layer 12 and the thicknesses thereof are determined on the following conditions:

① $V_{LC}$ is equal to or less than a liquid-crystal driving voltage (operating threshold); and ② When $V_{PC}$ is applied to the photoconductor structure 20, all of the P-layer 14 and the π-layer 12 become depleted of carriers. Further, the magnitude $E_P$ of the electric field in the P-layer 14 satisfies the following inequality:

$$E_P>2\times10^5 V/cm \quad (3)$$

When the write light FA is incident on this spatial light modulator, electron-hole pairs occur in the π-silicon portion (namely, the π-layer) 12. Further, the electrons are moved by the voltage developed across the depletion layer and then reach P-region. In this region, the electrons are put into the electric field of $2\times10^5$ V/cm or more. Then, chain-reacting ionization is caused in the crystal and moreover avalanche multiplication is performed therein. Furthermore, all of electrons generated as a result of this avalanche multiplication are stored in the pixel electrodes 17. As a consequence, in a portion on which the write light FA is irradiated, the voltage applied across the liquid crystal layer 9 increases and comes to exceed the liquid crystal threshold or voltage. Therefore, in this portion, the liquid crystal operates and the read light FC is modulated. Further, in case where a negative voltage is applied to the transparent electrode 8, all of the stored charges are swept away therefrom by the driving voltage. Finally, the device returns to the initial state thereof.

In the process described hereinabove, the number of electrons to be stored in the pixel electrodes correspondingly to an incident photon is increased by an order or two orders of magnitude as an effect of the avalanche multiplication thereof. Consequently, the sensibility of this spatial light modulator (namely, the first embodiment of the present invention) becomes higher extraordinarily in comparison with that of the conventional spatial light modulator.

Next, another spatial light modulator embodying the present invention (namely, the second embodiment of the present invention) will be described by referring to FIG. 2. The structure of the second embodiment is different from that of the first embodiment in that the N-guard rings are not formed in the second embodiment, that the width of the pixel electrode 17 is smaller than that of the P-layer 14 formed in the photoconductor structure 20, that the range $L_P$ in which the pixel electrodes 17 are formed is wider than the range $L_{LC}$ of the liquid crystal layer 9 in which liquid crystal is enclosed, and that the interval W between the P-layers 14 formed correspondingly to the adjacent pixel electrodes 17 is less than the depth D of the region which is depleted of carriers in a reverse state (namely, the thickness of the photoconductor structure 20 in case of the second embodiment). Namely, in case of the second embodiment, the P-layers 14 are formed correspondingly to the pixel electrodes 17, respectively, such that W<D. Thus the depletion layer formed in a reverse bias state in the photoconductor structure 20 becomes continuous between each pair of the adjoining pixel electrodes. Therefore, in case of the second embodiment of the present invention, undesirable concentration of the electric field does not occur without the guard rings 13, differently from the first embodiment. Consequently, the avalanche photodiode can be realized in the photoconductor layer 20 in the case of the second embodiment.

Thus, in case of the second embodiment, it is unnecessary to provide the guard ring layers 13 correspondingly to the pixel electrodes other than at least the outmost pixel electrodes. As the result, a high-density packaging of the pixel electrodes can be realized. Further, high-sensibility, as well as high-resolution, can be achieved. Moreover, the fabricating process can be simplified. As a consequence, the fabricating yield can be increased.

Figure 2:
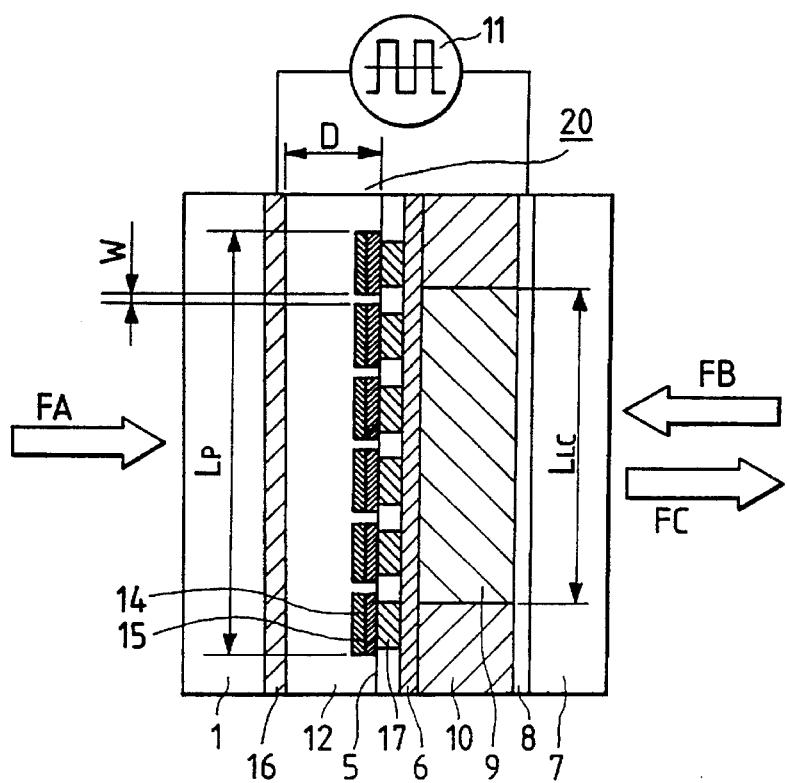
FIG. 2 is a sectional view of another spatial light modulator embodying the present invention (hereunder sometimes referred to as a second embodiment of the present invention)

Additionally, in case of the second embodiment, the range $L_P$ in which the pixel electrodes 17 are formed is wider than the range $L_{LC}$ of the liquid crystal layer 9 in which liquid crystal is enclosed, as illustrated in FIG. 2. Thus concentration of an electric field occurs in each of corners of peripheral portions of the diffusion layers ($N^+$ regions) corresponding to the outmost pixel electrodes 17. Consequently, even if a breakdown takes place in such a corner portion, an excessive voltage can be prevented from being applied to the liquid crystal layer 9.

Incidentally, the guard ring layers 1B may be provided correspondingly to the outmost pixel electrode, if necessary.

Figure 5:
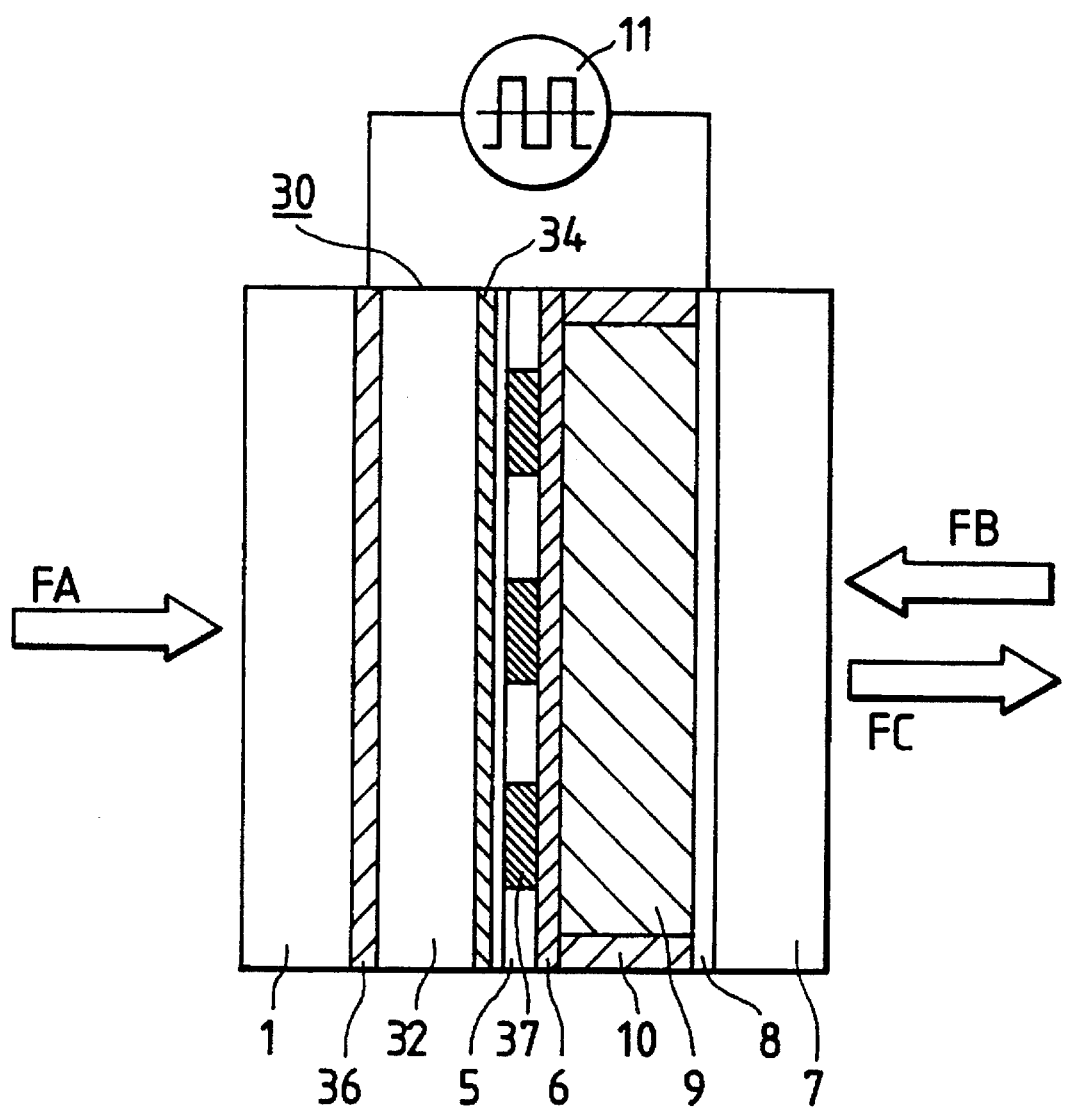
FIG. 5 is a sectional view of still another spatial light modulator embodying the present invention (hereunder sometimes referred to as a third embodiment of the present invention).

Next, a still another spatial light modulator embodying the present invention (namely, the third embodiment of the present invention), in which an N-type monocrystalline Si substrate is employed as the semiconductor substrate and Schottky-junction is employed in the pixel electrodes, will be described by referring to FIG. 5.

Namely, in case of the third embodiment, a high-resistance N-type monocrystalline Si substrate 32 is used as the semiconductor substrate. Further, it is preferable that the resistivity of the Si-substrate 32 is equal to or more than 300 ohms-centimeters (Ω·cm). Moreover, ion implantation of N-type impurities such as P, As or the like is performed on the surface of this Si-substrate 32, on which the write light FA is incident, to form a high dopant concentration layer as the transparent electrode 38. Thereafter, the surface of the Si-substrate 32, on which the read light FB is incident, is polished such that the polished surface thereof becomes like a mirror surface and the Si-substrate 32 has a predetermined thickness. Subsequently, ion implantation of the N-type impurities such as P is performed on the polished surface of the Si-substrate 32 to form an N-layer 34 serving as an avalanche multiplication layer. At that time, the implantation depth is determined by controlling what are called a substrate surface direction, an implantation angle and an acceleration voltage. Further, it is desirable that what is called an implantation peak concentration is from $1\times10^{16}$ to $1\times10^{17}$ cm$^{-3}$ and the implantation depth is from 0.5 to 2 micrometers (μm). Moreover, after the ion implantation, dopants are activated by effecting a high-temperature anneal and thus the transparent electrode 36 is bonded to the transparent insulating substrate 1. Next, for instance, a silicon nitride film is formed at the side of the N-layer 34 of the Si-substrate 32 as the insulating film 5 by using a plasma-enhanced CVD apparatus. Then, windows are formed like grids in this insulating film 5 by utilizing the photolithography techniques. Further, a film of a Schottky-junction metal such as Pt is formed in each of the windows by effecting, for example, a sputtering. Thus the pixel electrodes 37 are formed. Thereafter, similarly as in case of the conventional spatial light modulator of FIG. 3, the dielectric mirror layer 8 is formed and the liquid crystal layer 9 is enclosed between the transparent insulating substrate 7 and the dielectric mirror layer 6. In this way, the spatial light modulator of this embodiment (namely, the third embodiment of the present invention) is fabricated.

As described above, in case of the third embodiment, Schottky junctions are employed instead of PN junctions, differently from the first and second embodiments previously described. As a consequence, a diffusion step is unnecessary in the process of fabricating the third embodiment. Thus, the process can be simplified and the pixel electrode pitch can be decreased. As the result, a high-density packaging of the pixel electrodes can be achieved.

Moreover, the potential barrier between each pair of the pixel electrodes is large in case of the third embodiment. Thus, the dynamic range can be large.

Furthermore, in case of the spatial light modulator according to the third embodiment, the N-layer 34 acting as the avalanche multiplication layer is not partitioned correspondingly to the pixel electrodes 37 but is formed in common to all of the pixel electrodes 37, differently from the first and second embodiments. Thus the depletion layer formed in the photoconductor structure 30 has extremely good continuity. Further, undesirable concentration of an electric field does not occur therein at all. Consequently, an avalanche photodiode structure can be realized in the photoconductor structure 30.

While preferred embodiments of the present invention have been described above, it is to be understood that the present invention is not limited thereto and that other modifications will be apparent to those skilled in the art without departing from the spirit of the invention. For example, in cases of the first to third embodiments of the present invention, PN-junction and Schottky-junction are employed for storing electric charges. However, even in case where PIN-junction is used in place of PN-junction and Schottky-junction, similar effects can be obtained if the modulator is provided with a low-resistance layer being capable of causing avalanche multiplication. Additionally, an amorphous semiconductor may be employed as the photoconductor layer.

The scope of the present invention, therefore, is to be determined solely by the appended claims.

What is claimed is:

1. A spatial light modulation device having a photoconductor structure, a dielectric mirror layer and a light-modulating liquid crystal layer arranged in a multilayer structure in that order, the photoconductor structure comprising:

a plurality of pixel portions, on each of which light is incident, for respectively performing avalanche multiplication of charges generated due to the incident light and storing multiplied charges obtained as a result of the avalanche multiplication therein.

2. A spatial light modulation device having a semiconductor substrate, a photoconductor structure, a dielectric mirror layer and a liquid crystal layer arranged in a multilayer structure in that order, the photoconductor structure comprising:

a diode array of Schottky diodes formed on the semiconductor substrate; and a high concentration region which is formed in a vicinity of a Schottky junction of each Schottky diode of the diode array and inside of the semiconductor substrate and has a same conductivity type as the semiconductor substrate does, wherein a dopant concentration of the high concentration region is higher than that of the semiconductor substrate and a depletion region of the photoconductor structure, which is depleted of carriers in a reverse bias state by light incident on the photoconductor structure, performs avalanche multiplication of charges injected in the photoconductor structure.

3. The spatial light modulator according to claim 2, wherein a distance W between two Schottky diodes of the diode array adjacent to each other is less than a depth D of the depletion region of the photoconductor structure.

4. A spatial light modulation device having a semiconductor substrate, a photoconductor structure, a dielectric mirror layer and a liquid crystal layer arranged in a multilayer structure in that order, the photoconductor structure comprising:

a diode array of PN diodes formed on the semiconductor substrate; and a high concentration region which is formed in a vicinity of a PN junction of each PN diode of the diode array and inside of the semiconductor substrate and has a same conductivity type as the semiconductor substrate does, wherein avalanche multiplication of charges injected in the photoconductor structure is performed in a depletion region of the photoconductor structure depleted of carriers in a reverse bias state due to light which is incident on the photoconductor structure and a dopant concentration of the high concentration region is higher than that of the semiconductor substrate.

5. The spatial light modulator according to claim 4, wherein a distance W between two PN diodes of the diode array adjacent to each other is less than a depth D of the depletion region of the photoconductor structure.

6. A spatial light modulation device having a semiconductor substrate, a photoconductor structure, a dielectric mirror layer and a liquid crystal layer arranged in a multilayer structure in that order, the photoconductor structure comprising:

a diode array of PIN diodes formed on the semiconductor substrate; and a high concentration region which is formed in a vicinity of a PIN junction of each PIN diode of the diode array and inside of the semiconductor substrate and has a same conductivity type as the semiconductor substrate does, wherein avalanche multiplication of charges injected in the photoconductor structure is performed in a depletion region of the photoconductor structure depleted of carriers in a reverse bias state due to light which is incident on the photoconductor structure and a dopant concentration of the high concentration region is higher than that of the semiconductor substrate.

7. The spatial light modulator according to claim 6, wherein a distance W between two PIN diodes of the diode array adjacent to each other is less than a depth D of the depletion region of the photoconductor structure.

8. A spatial light modulation device having a semiconductor substrate, a photoconductor structure, a dielectric mirror layer and a liquid crystal layer arranged in a multilayer structure in that order, the photoconductor structure comprising:

a diode array of a plurality of pixel electrodes, formed on the semiconductor substrate, which each have a Schottky junction; and a high concentration region which is formed in a vicinity of the Schottky junction of each pixel electrode of the diode array in common to the plurality of pixel electrodes and inside of the semiconductor substrate and has a same conductivity type as the semiconductor substrate does, wherein avalanche multiplication of charges injected in the photoconductor structure is performed in a depletion region of the photoconductor structure depleted of carriers in a reverse bias state due to light which is incident on the photoconductor structure and a dopant concentration of the high concentration region is higher than that of the semiconductor substrate.

9. A spatial light modulation device having at least a photoconductor structure and a light modulator, the photoconductor structure and the light modulator having a multilayer structure, the photoconductor structure comprising:

a diode array of PN diodes formed on a semiconductor substrate; and a high concentration region which is formed in a vicinity of a PN junction of each diode of the diode array and inside of the semiconductor substrate and has a same conductivity type as the semiconductor substrate does, wherein in a depletion region which is depleted of carriers in a reverse bias state, avalanche multiplication of charges injected therein is performed due to light which is incident thereon, wherein the dopant concentration of the high concentration region is higher than that of the semiconductor substrate, wherein a distance W between adjacent diodes of the diode array is less than a depth D of the depletion region.

* * * * *